United States Patent [19]

Massey et al.

[11] Patent Number: 5,119,020
[45] Date of Patent: Jun. 2, 1992

[54] ELECTRICAL CABLE ASSEMBLY FOR A SIGNAL MEASURING INSTRUMENT AND METHOD

[75] Inventors: Gaines N. Massey, Taylors; Sam S. Shasteen, Greenville; Anthony M. Salvatore, Travelers Rest; Herbert C. Beck, Simpsonville; Gary A. Mongeau, Greenville, all of S.C.

[73] Assignee: Woven Electronics Corporation, Greenville, S.C.

[21] Appl. No.: 431,909

[22] Filed: Nov. 6, 1989

[51] Int. Cl.$^5$ .................. G01R 1/02; G01R 1/067
[52] U.S. Cl. .................. 324/158 F; 324/72.5; 324/158 P; 324/149; 439/502
[58] Field of Search .......... 439/651, 653, 502, 76, 439/54, 357, 358; 324/72.5, 149, 158 P, 158 F, 126, 128

[56] References Cited

U.S. PATENT DOCUMENTS

| | | | |
|---|---|---|---|
| 3,933,406 | 1/1976 | Cameron et al. | 439/358 |
| 4,008,941 | 2/1977 | Smith | 439/358 |
| 4,143,236 | 3/1979 | Ross et al. | 174/117 F |
| 4,154,977 | 5/1979 | Verma | 439/502 |
| 4,433,888 | 2/1984 | Winger | 439/357 |
| 4,508,403 | 4/1985 | Weltman et al. | 439/502 |
| 4,574,235 | 3/1986 | Kelly et al. | 324/158 P |
| 4,579,407 | 4/1986 | Shimada | 439/502 |
| 4,650,933 | 3/1987 | Benda et al. | 439/60 |
| 4,689,721 | 8/1987 | Damerow et al. | 439/76 |
| 4,714,433 | 12/1987 | Rider, Jr. | 439/357 |
| 4,716,500 | 12/1987 | Payne | 439/502 |
| 4,723,822 | 2/1988 | Merdic | 439/502 |
| 4,777,326 | 10/1988 | Zamborelli | 174/117 M |
| 4,822,303 | 4/1989 | Nakamura et al. | 439/76 |
| 4,829,244 | 5/1989 | Tom et al. | 324/158 F |
| 4,931,598 | 12/1988 | Calhoun et al. | 174/117 F |

OTHER PUBLICATIONS

"An HF Probe for an Oscilloscope", by Meadows et al., Radio Communic. Dec./1980, vol. 56, No. 12, pp. 1284-1285.
"Nanosecond Passive Voltage Probes", by McGowen, IEEE Trans. on Instrumentation and Meas., vol. IM-26, #1, Mar./1977, pp. 46-52.
"Passive Oscilloscope Probe", by Elektor, Jan./1979, vol. 5, #1, pp. 1-30 and 1-31.

Primary Examiner—Kenneth A. Wieder
Assistant Examiner—William J. Burns
Attorney, Agent, or Firm—Cort Flint

[57] ABSTRACT

A cable assembly (A) is disclosed for a logic analyzer which comprises a flat woven cable (14) having an analyzer connector (18) and a probe connector (22). The analyzer connector includes a printed circuit board (32) and the probe connector includes a printed circuit board (34). Resistor-capacitor networks (D, E) are carried on respective PC board (32, 34) for extending the effective bandwidth of the cable assembly. A cable assembly (A") is disclosed having a low capacitance provided by high gauge signal conductors (92) and increased center-to-center spacing between the signal conductor and exclusively associated ground wires (94a, 94b). Resistor netowkrs (D', E') provide a high input resistance to the cable assembly. An interface shroud (B) connects terminal (C) of probe leads (10) to probe connector (22). A plurality of exterior grooves (54) are formed on an upper wall (44) of interface shroud (B) which receive locking arm (62) of terminal body (60). A trigger ramp (74) allows locking arm (62) to be quickly disengaged.

20 Claims, 7 Drawing Sheets

ELECTRICAL CABLE ASSEMBLY FOR A SIGNAL MEASURING INSTRUMENT AND METHOD

BACKGROUND OF THE INVENTION

The invention relates to an electrical cable assembly, and, more particularly to a cable assembly for connecting a test circuit to a measuring instrument such as a logic analyzer or like instrument which analyzes timing signals from the test circuit.

A logic analyzer is typically used to display several lines of information related to the logic state of a circuit, and/or the point in time when detectable events occur within the circuit. The more precisely the logic analyzer can determine the exact point that the events occur, the more accurately the technician can evaluate the performance of the circuit.

A prior art logic analyzer cable is illustrated in FIG. 1 of U.S. Pat. No. 4,777,326 having a pod containing a resistor-capacitor attenuation circuit for each probe near the probe tip which is connected to a test circuit. A twisted pair cable attaches the pod to the measuring instrument, logic analyzer and the like, while a single wire connects the pod to the probe tip. The twisted pair cable is said to provide some shielding and crosstalk reduction, but that crosstalk is developed in the probe lead and additional shielding is still desired. The location of resistor-capacitor networks in the pod and not at the probe tips, is said to cause the probes to have a higher input capacitance. The resonant circuit formed by the single wire inductance and capacitance is said to limit the bandwidth of the probes.

U.S. Pat. No. 4,777,326 uses a resistive wire in a flat woven cable instead of a lump resistor in a network. The resistive wires for signals are said to alternate with lossless wires for ground to form a lossy transmission line. The cable is said to provide an effective bandwidth, and accurate signal duplication. The resistive wire is woven with conductive ground wires along each side for shielding.

It is known in the art to provide a woven resistive wire cable as described above which is terminated with conventional pin/socket connectors and to provide an interface shroud which fits over the connector at the probe end into which the probe leads are inserted and interlocked to mate with predetermined resistive wires to transmit test signals to the logic analyzer. U.S. Pat. Nos. 4,822,303; 4,433,888; and 4,008,941 show other typical cable assemblies having interlocking cable end parts for adapting various cable connectors and lead tips together.

Accordingly, an object of the invention is to provide a cable assembly and method for a logic analyzer which transmits high frequency logic signals from a logic circuit to a logic analyzer in an accurate manner for analysis over a wide bandwidth.

Another object of the invention is to provide a cable assembly for a logic analyzer and the like measuring instruments for transmitting high frequency signals from a test circuit with high fidelity over a wide bandwidth for analyzing a broad frequency range.

Another object of the present invention is to provide a cable assembly for a logic analyzer and the like for transmitting high frequency logic signals in which probe leads connected to the logic circuit may be easily connected and disconnected in the cable assembly in a reliable manner.

Another object of the present invention is to provide an electrical cable assembly for a signal measuring instrument which has a low input capacitance and high input resistance for broad bandwidth and high fidelity signal transmission.

Another object of the invention is to provide a cable assembly for a logic analyzer and the like for transmitting high frequency logic signals from a logic circuit to a logic analyzer wherein a conventional flat woven controlled impedance cable is utilized with resistor capacitor networks at each end to provide a wide bandwidth over which frequency signals may be transmitted and analyzed. This cable may be symmetrical or asymmetrical in construction.

SUMMARY OF THE INVENTION

The above objectives are accomplished according to the present invention by terminating an electrical cable which transmits the high frequency logic signals by a connector which may be connected to an analyzer, and a connector which may be connected to a probe. Each of those connectors has a printed circuit (PC) board on which are formed resistor-capacitor networks which provide an effective broad bandwidth for the cable assembly. The resistor-capacitor networks on each PC board may have a different capacitance value and/or resistance value. Preferably, by making the ratio of the capacitance values about 2:1, a broad effective bandwidth is provided with sharpened rise and fall times to accurately determine the switching points of the logic signals under test Alternately, a low capacitance may be built into the transmission cable and a high resistance provided by resistors on the PC boards. An interface shroud connects to the probe connector and has exterior grooves which receive a locking arm of a terminal of the probe lead. The terminal body fits within a vertical slot in the interface shroud in a tight fit so that reliable connection is made between the probe lead and electrical circuit for reliable transmission of accurate signals. In accordance with the present invention, the combination of a controlled impedance/capacitance cable and one or more resistor and/or capacitor circuits provides greater fidelity of the signal over a broader bandwidth. The signal is cleaner and more accurate for determining the timing point for switching. The controlled impedance/capacitance cable shields the signal line and preserves the quality of the signal to the logic analyzer. Good signal quality provides good timing accuracy and improvement of accuracy of determining timing events. The resistor and/or capacitor circuits enhance the sharpness of the leading edge of the signal. The logic analyzer can clearly see a signal in a particular range of frequencies (bandwidth). The cable has a capacitance which permits the frequencies to pass easily.

DESCRIPTION OF THE DRAWINGS

The construction designed to carry out the invention will hereinafter be described, together with other features thereof. The invention will be more readily understood from a reading of the following specification and by reference to the accompanying drawings forming a part thereof, wherein an example of the invention is shown and wherein.

DESCRIPTION OF A PREFERRED EMBODIMENT

Figure 1:
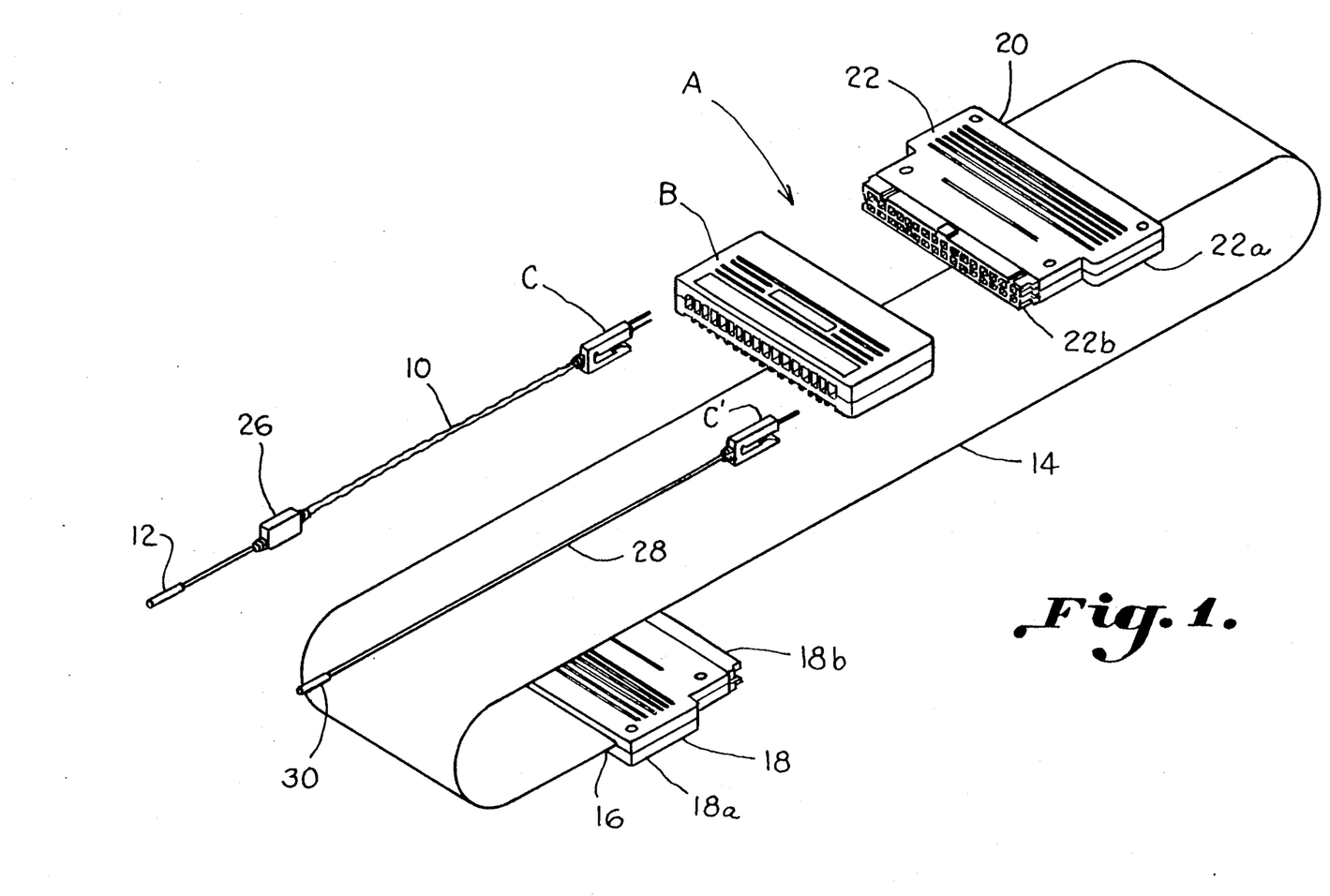
FIG. 1 is a perspective view of a cable assembly for a logic analyzer constructed according to the invention.

Referring now in more detail to the drawings, a cable assembly, designated generally as A, is disclosed for a logic analyzer and the like measuring instrument. Cable assembly A includes a plurality of probe leads 10 having probe tips 12 connectable to a test circuit (not shown). An electrical transmission cable 14 is terminated at a first end 16 to a first, analyzer connector 18 connectable to a logic analyzer and the like measuring instrument. Electrical cable 14 includes a second end 20 terminated at a second, probe connector 22. Connectors 18 and 22 include back shells 18a and 22a which provide strain relief, protection for internal components, and include connector bodies 18b and 22b with electrical contacts. An interface shroud, designated generally as B, receives connector 22 for connecting probe leads 10 to the logic analyzer or like equipment by way of cable 14. For this purpose, probe lead terminal C terminates the end of probe lead 10 opposite probe tip 12. An RC circuit is provided in a conventional manner at 26 to sharpen the test signal coming from the test circuit delivered to the logic analyzer. There is a ground probe lead 28 having a probe tip 30 and a terminal C' which interlocks in interface shroud B for connection to second connector 22. Electrical cable 14 is preferably a flat woven electrical transmission cable of the type disclosed in U.S. Pat. No. 4,143,236, incorporated herein by reference. The woven cable includes a plurality of signal conductors extending longitudinally in the cable with ground conductors extending along the sides of the signal conductor to shield the signals. The geometry of the signal conductors and ground conductors are fixed in a weave pattern so that the impedance of the cable is controlled and fixed, reference may be had to the patent for more detail.

Figure 2:
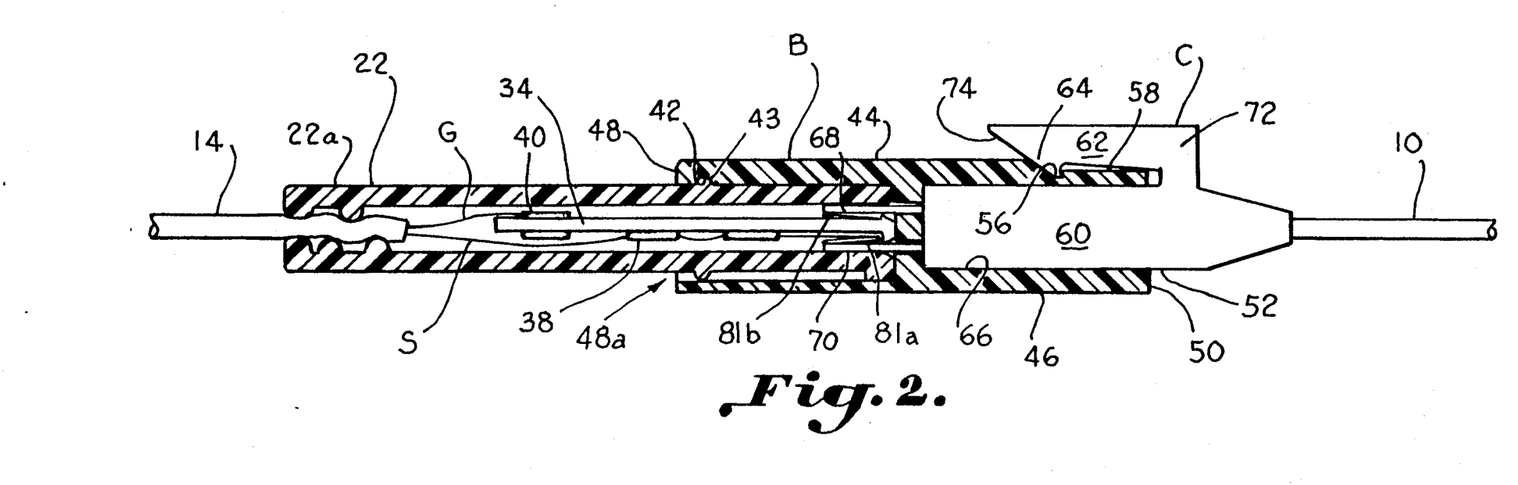
FIG. 2 is a sectional view of the probe connector and interface shroud and probe terminal according to the invention.
Figure 3:
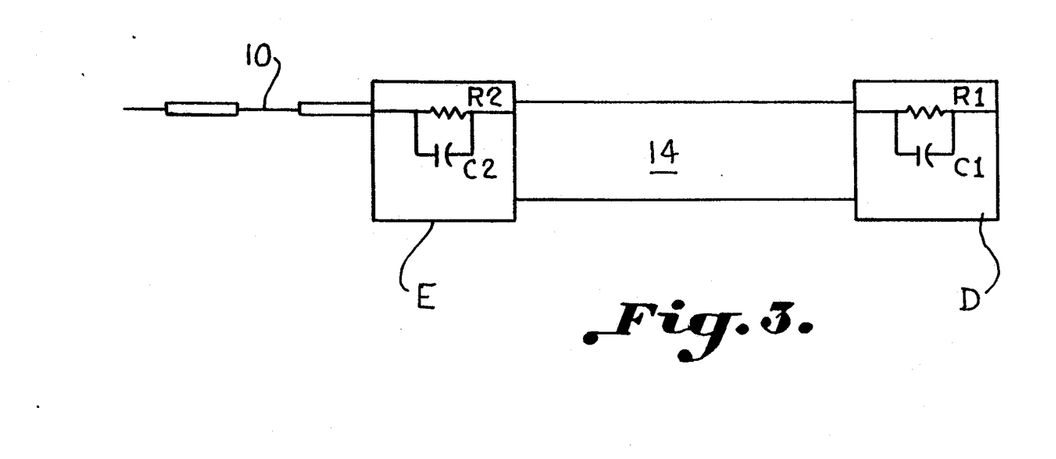
FIG. 3 is a schematic diagram of typical resistor-capacitor networks at the probe and analyzer ends of the cable for providing a broad bandwidth according to the invention.
Figure 5:
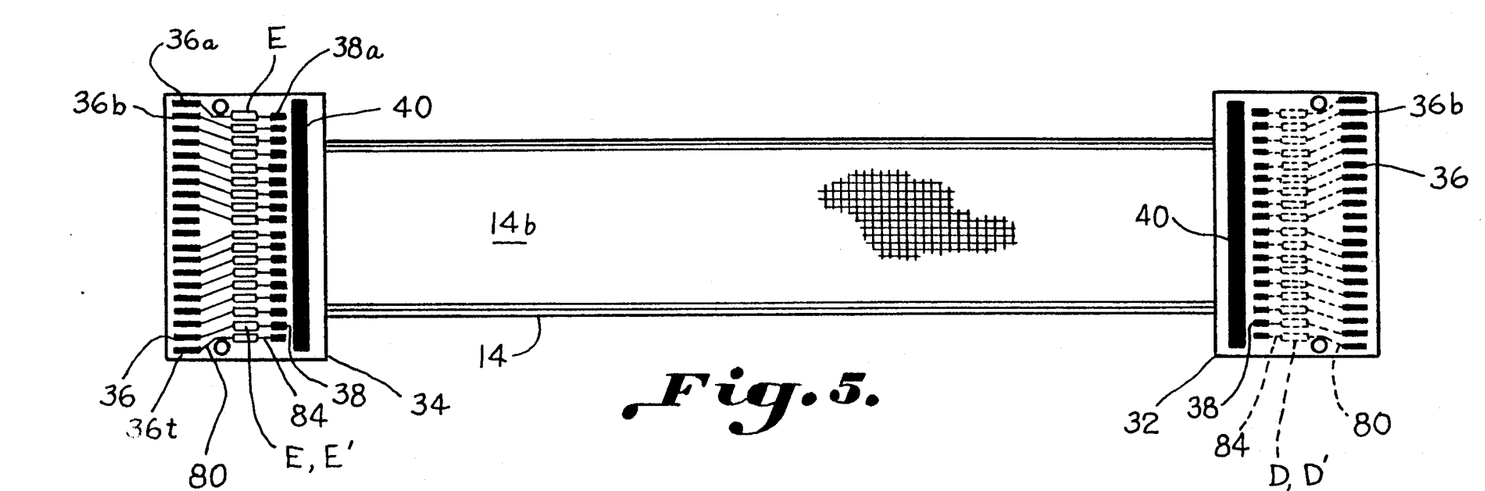
FIG. 5 is a bottom plan view of an electrical transmission cable terminated at PC boards for use in a logic analyzer cable assembly according to the invention, connector and shells are not shown.
Figure 6:
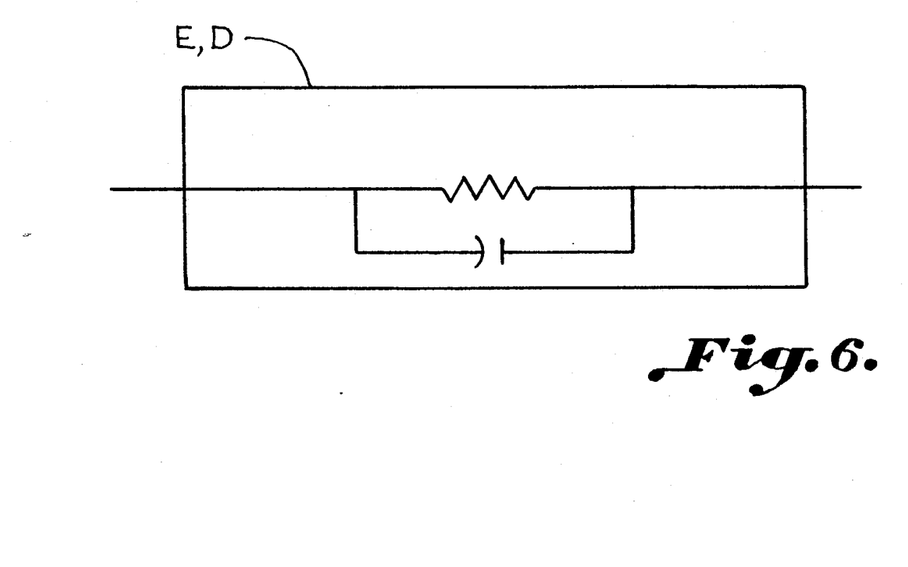
FIG. 6 is a schematic diagram of a resistor-capacitor network.
Figure 7:
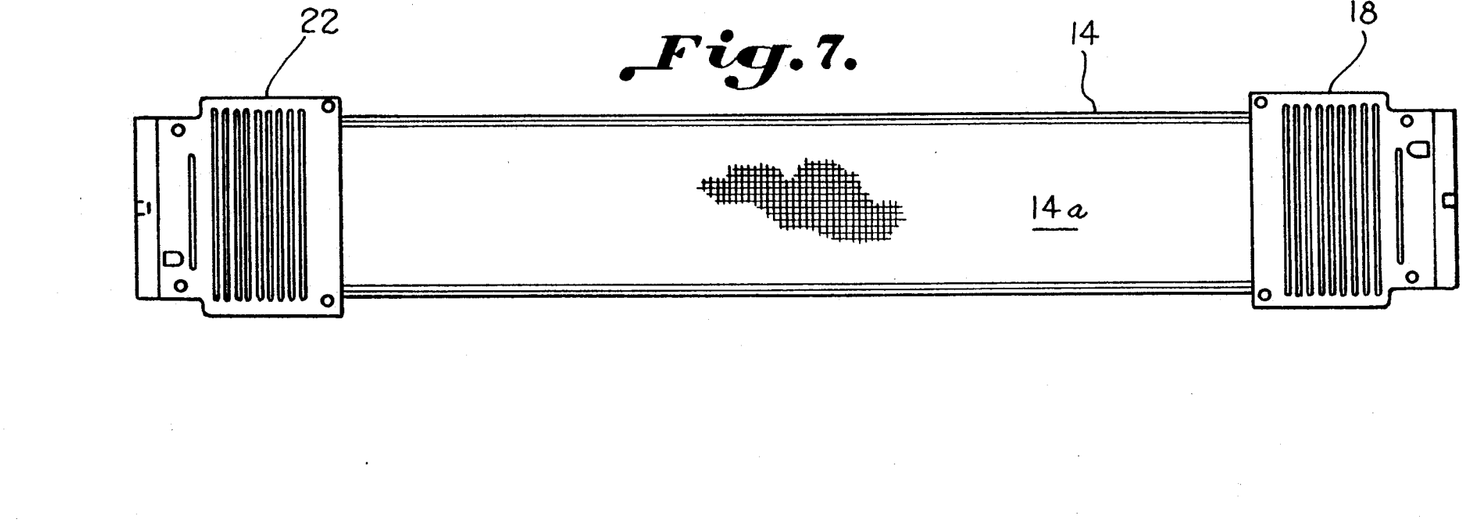
FIG. 7 is a top plan view of an electrical cable for a logic analyzer cable assembly according to the invention.
Figure 8:
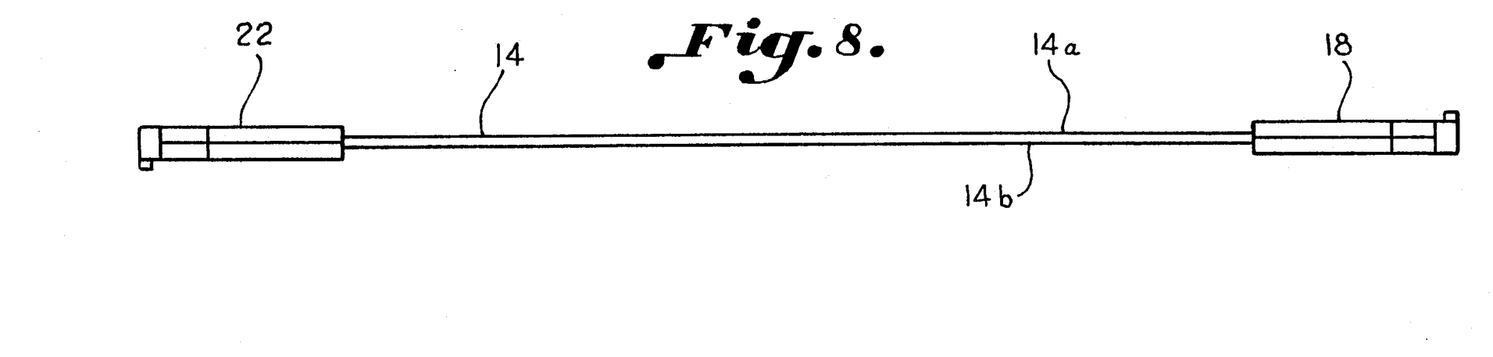
FIG. 8 is a side elevation of the cable of FIG. 7.
Figure 11:
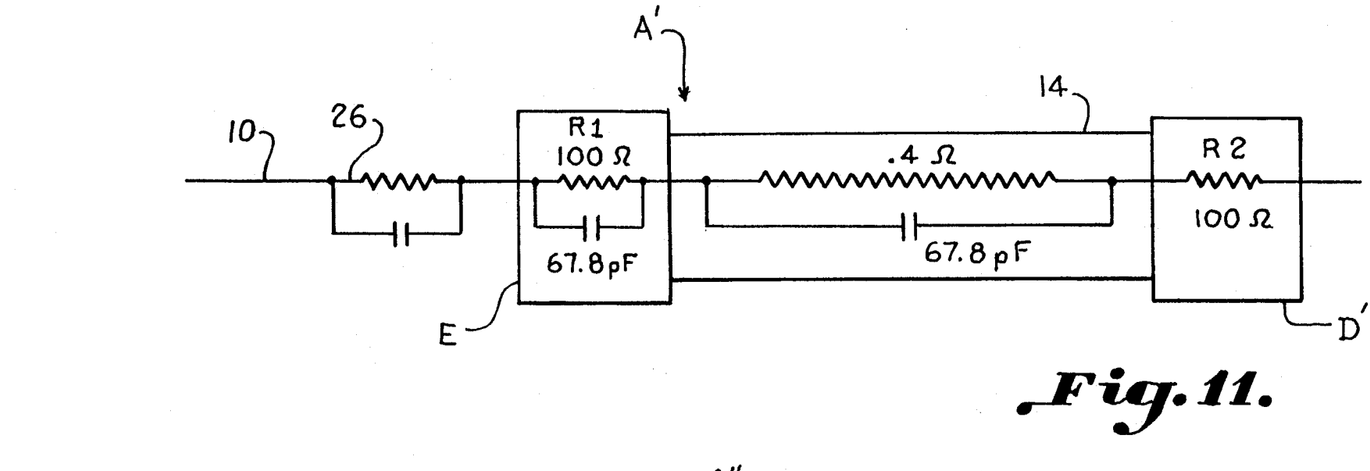
FIG. 11 is a schematic diagram of an alternate embodiment of an electrical configuration of a cable assembly according to the invention.

As can best be seen in FIGS. 3 and 5, there may be a resistor-capacitor (RC) network D carried between the logic analyzer and cable 14 and a second resistor-capacitor network E carried between cable 14 and probe leads 10 on the probe end of the cable. Alternately, there may be an RC network at only one end (FIG. 11). Resistor-capacitor networks D and/or E provide a network means for widening the effective bandwidth of the cable assembly for transmitting accurate signals between the test circuit and measuring instrument over a wide range of frequencies. As can best be seen in FIGS. 5 and 6, the resistor-capacitor networks D and E are carried on printed circuit boards 32 and 34 respectively within connectors 18 and 22 respectively. Cable assembly A is illustrated as accommodating 18 probe leads, the number of probe leads is not restrictive. The two outer probes as shown carry power and connect to lands 36a and 36t. Power probes do not necessarily have to include an RC network as shown. The remaining probes may be used for test signals. As can best be seen in FIG. 5, there are individual RC circuits E on circuit board 34 which are connectable to terminals C of the probe leads by means of lands 36 and the contacts of connector body 22b. The RC circuit may be implemented by discrete components mounted to or integral with the PC or may be combined in multiple arrays in a DIP type package The signal wires "S" (FIG. 2) of cable 14 are connected to lands 38 on PC boards 34 and 32 and the RC networks E and/or D are connected to lands 36 and/or 38 on the PC boards. User selectable lands may be used to connect ground probes to the test circuit ground, as in 36a and 38a in the embodiment. The ground conductors "G" in woven cable 14 which extend side by side with the signal conductors are terminated at a ground plane 40. The PC board 32 inside logic analyzer connector 18 is terminated identically but faces the first, reverse side 14a of electrical cable 14. In this manner there is a one-to-one hook up between the test circuit and the logic analyzer connectors. For example, as can best be seen in FIG. 5, land 36b on PC board 34 follows through the cable assembly to land 36b of PC board 32 so that the signal follows all the way through the cable assembly. This one-to-one hook up is provided by the 180° rotation of the PC boards within connectors 18 and 22, as can best be seen in FIG. 5.

Figure 4:
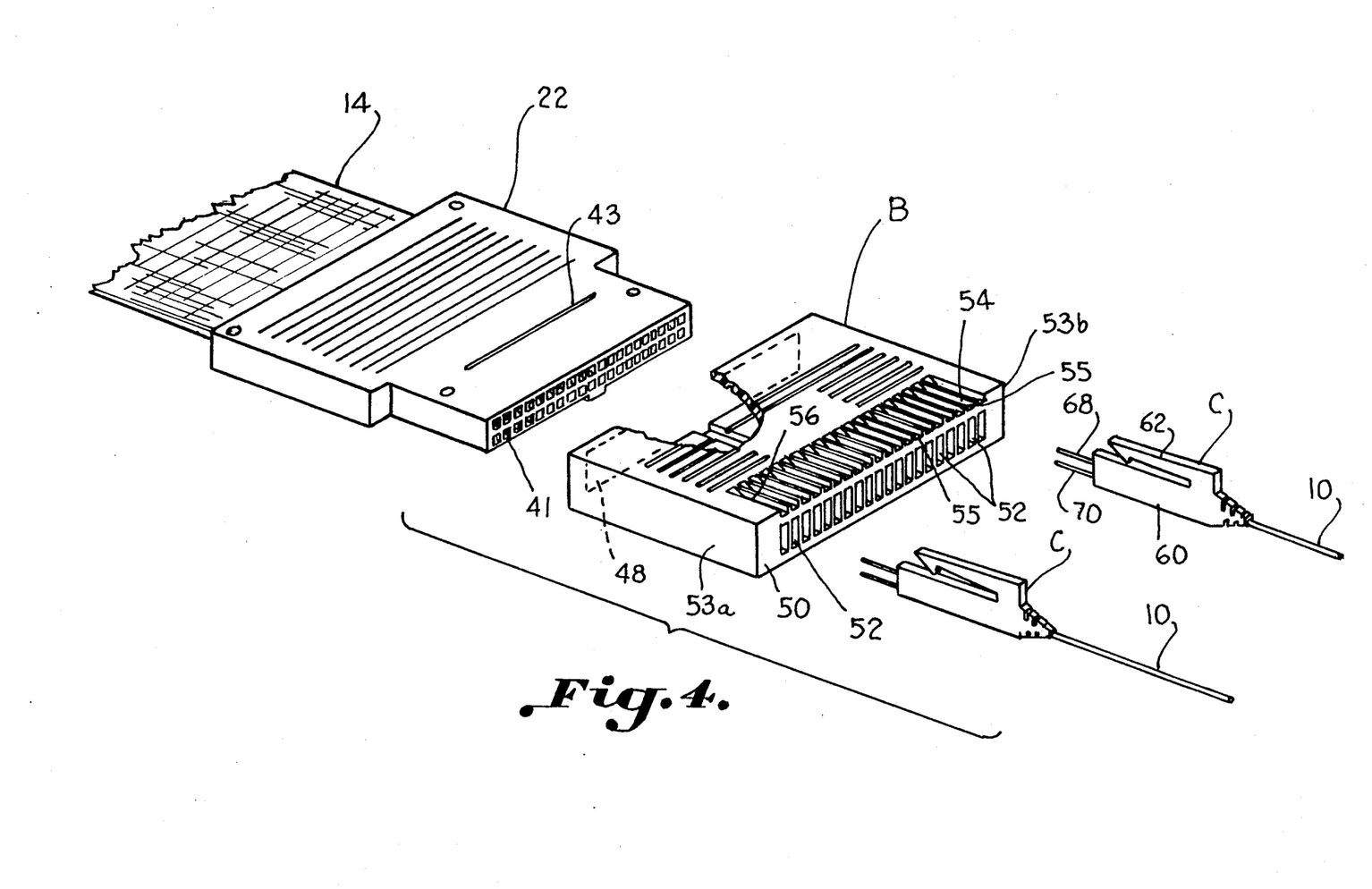
FIG. 4 is a perspective view with parts exploded illustrating a cable assembly having an electrical cable, probe connector, and interface shroud for connecting probe leads to the cable in accordance with the invention.

Each cable connector 18 and 22 may include a plurality of conventional pin sockets 41, as can best be seen in FIGS. 2 and 4, in probe connector 22. Interface shroud B fits over the end of connector 22 and includes a detent 42 which receives a ridge 43 molded on connector 22 to form a lock. Interface shroud B includes an upper wall 44, a lower wall 46, a first face 48, and a second face 50 bridging the upper and lower walls, and first and second side walls 53a and 53b integral with the upper and lower walls and first and second faces. A connector opening 48a is formed in first face 48 of shroud B. A plurality of vertical terminal receiving slots 52 are formed in second face 50 for receiving individual probe terminals C. There are a plurality of exterior grooves 54 formed on upper wall 44 of shroud B corresponding to vertical slots 52. The exterior grooves extend longitudinally along the upper wall from an open end 55 to a detent 56 formed in a floor 58 of each exterior groove 54. Probe terminal C includes a terminal body 60 and a flexible hinged locking arm 62 having a locking element 64 extending downwardly into detent 56 of exterior groove 54.

In use, terminal C is inserted in vertical slot 52 and locking element 56 enters open end 55 of an exterior groove 54 which corresponds to a vertical slot 52. As terminal C is pushed forward, locking element 64 slides along floor 58 of exterior groove as terminal body 60 slides within a cavity 66. As can best be seen in FIG. 2, it will be noted that terminal body 60 and cavity 66 generally correspond in their cross-section so that there is a tight fit of terminal body 60 within cavity 66 for reliability and locking. There are a pair of electrical contacts 68 and 70 carried by terminal body 60 which make electrical contact with probe lead 10. An elastic hinge is provided at 72 so that locking arm 62 may lock in exterior groove 54 and be released. There is a downwardly extending trigger ramp 74 which extends from a generally pointed terminal end of locking arm 62 to locking element 64. As can best be seen in FIG. 2, a portion of ramp 74 extends above upper wall 44 of shroud B so that a finger of a person releasing terminal C may easily lift locking element 64 upwards releasing it from detent 56. Once locking element 64 is on the groove floor, terminal C may easily be removed from shroud B.

As can best be seen in FIGS. 2 and 5, connector contacts 81a are connected to lands 36 which are connected to RC networks E by traces 80, and then by means of electrical traces 84 to a lands 38. The signal transmitting wires S of electrical cable 14 are connected to lands 38 to thereby transmit logic signals from the circuit undergoing tests through probe leads 10 to the logic analyzer. Connector contacts 81b are connected to ground plane 40 through a ground trace on the PC board. Ground wires G of cable 14 are terminated at ground plane 40. The same is true for the remaining wires in electrical cable 14 which are terminated at the analyzer end to PC board 32 in a one-to-one termination as previously described.

The capacitance of cable 14 and the selected capacitor of network 26 provide a sharp rise time consistent with the signal being studied. The resistors R1 and R2 of networks D and E subdue anomalies in the signal, and work with the capacitors C1 and C2 to provide broadband response. The electrical parameters of the cable may be selectively matched to specific requirements of the application being made, and may be fine tuned to provide optimum signal analysis at specific frequencies of interest. In one application, a cable was used having a capacitance of 67.8 pF, impedance of 100 ohms, resistance of 0.4 ohms, and length of 56.75 inches. Network E included a 100 ohm resistor and 72 pF capacitance. Network D included a 100 ohm resistor and 140 pF capacitance. The resistor-capacitor network D and E on each end of a conventional controlled impedance cable, having a length of 56.75 inches, reduces the input capacitance of the cable assembly and in conjunction with the 100 ohm resistor R2 to reduce the noise content of the signal. At the analyzer end, a 140 pF capacitor is used to further reduce the capacitive loading of the system under test and in conjunction with resistor R1 further reduce signal anomalies at the analyzer. Suitable resistor values range from 100 to 400 ohms, and capacitor values from about 70 to 140 pF.

An alternate embodiment of the invention is illustrated in FIG. 11, wherein a cable assembly A' is illustrated with capacitor C1 removed with the intent of providing a correct input capacitance (C2=67.8 pF) and signal smoothing resistors (100 ohms, R1 and R2) without inhibiting the bandwidth of the system. In FIG. 3, the capacitor C1 truncated the lower end of the bandwidth, for example, 100 kHz, and C2 limits the upper end to 400 MHz. In FIG. 11, a typical bandwidth may also be 1 k Hz to 400 MHz may also be provided. The capacitance of network E is matched to cable 14 to provide a characteristic capacitance of 34 pF. The performance of the assembly is generally as satisfactory as the unmatched configuration of FIG. 3, without the additional capacitor element.

Figure 9:
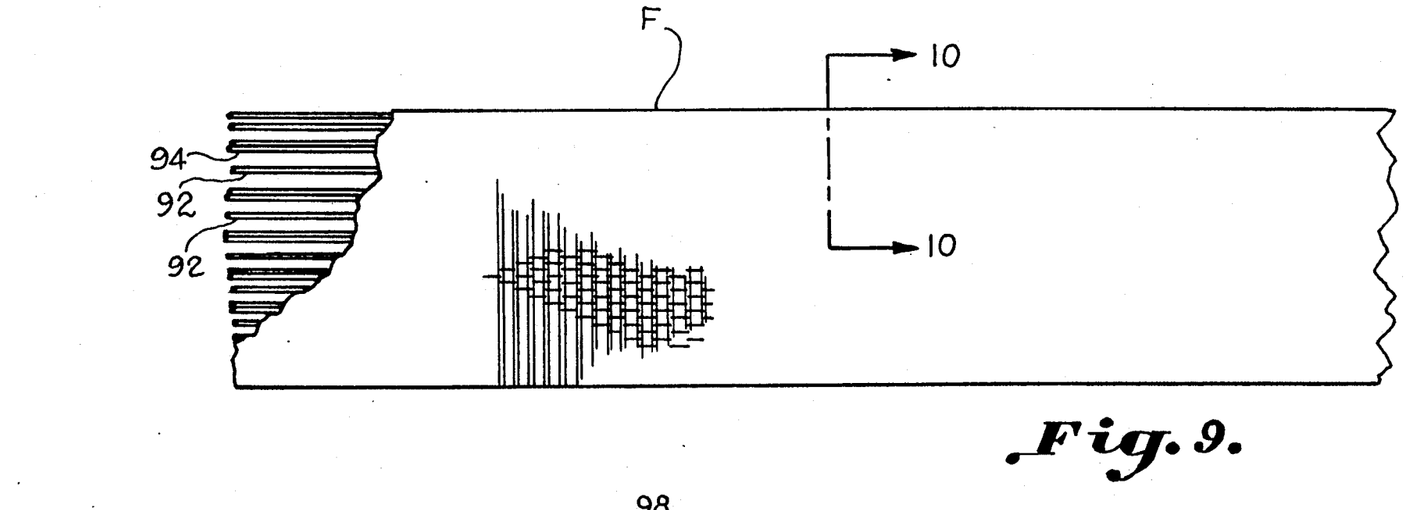
FIG. 9 is a top plan view of a controlled low capacitance electrical transmission cable for a cable assembly for a signal measuring instrument according to the invention.
Figure 10:
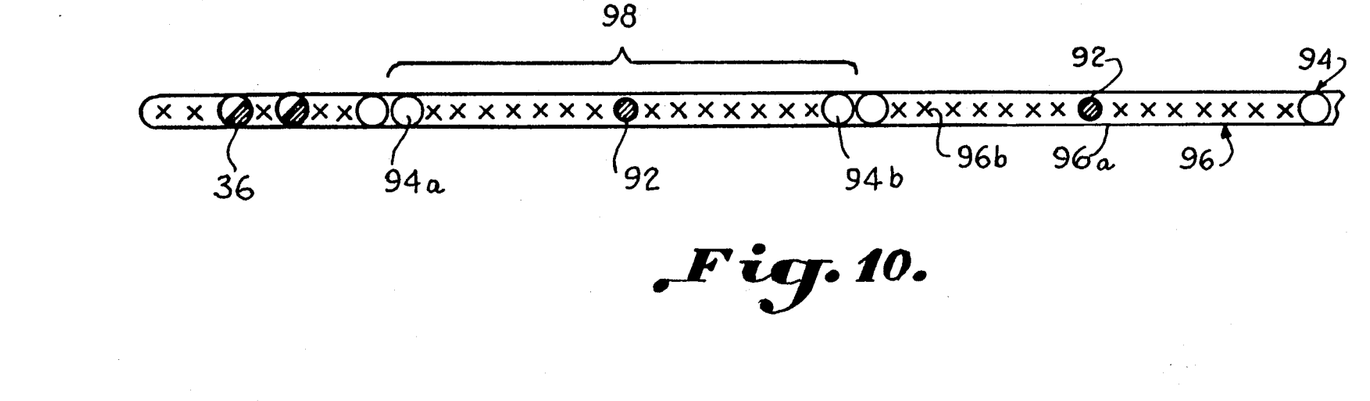
FIG. 10 is a sectional view taken along line 10—10 of FIG. 9.

As can best be seen in FIGS. 9 and 10, a controlled, low capacitance cable F is illustrated having a plurality of signal conductors 92 and ground conductors 94. There is an exclusive ground conductor 94 on each side of each signal conductor 92 and the conductors are woven together in a fabric which includes weft yarn 96a and warp yarns 96b as disclosed in U.S. Pat. No. 4,143,236, previously incorporated by reference in this application. Signal conductors 92 are a small diameter wire with a suitable insulation coating. Preferably, signal conductors 92 are a 40 AWG alloy 135 copper wire with a silver plating. The silver plating on the signal conductors is believed to provide advantageous effects in certain applications such as faster transmission at certain high frequencies resulting in sharper leading edges of the test signals. A suitable signal wire is available from Phelps Dodge Copper Products of Elizabeth, New Jersey, designated as PD-135 copper alloy. The wire is a highly conductive, high strength, high ductability copper alloy with average values of 450 MPa, 12% elongation at 250 mm., and electrical conductivity of 90% IACS. The wire has a diameter of 0.0031 inches and a resistance of about 1.07 ohms per foot. As can best be seen in FIG. 10, the center-to-center spacing of the signal conductor and its associated ground conductors is increased over conventional cable to provide a low capacitance. In the illustrated embodiment, a cable having a length of 56.75 inches was woven having a capacitance of about 34 pF. This provides a low input capacitance and low loading for the probe connected to a test circuit by probe lead 10.

As can best be seen in FIG. 10, the signal ground wires are arranged in clusters 98 which include 32 AWG ground conductors 94a and 94b on each side of a signal conductor 92. In the exemplary cable described above, the capacitance of the cable was established by weaving the 40 AWG signal wires and 32 AWG ground wires with a center-to-center spacing of approximately 0.057 inches. The gauge of the signal conductor and the center-to-center spacing of each cluster 98 provides the desired capacitance. Previous controlled impedance cables manufactured in accordance with U.S. Pat. No. 4,143,236 have been made with impedances typically in the range of 50–120 ohms using conventional signal wires. In accordance with the present invention, low capacitance cable F, in the exemplary embodiment, has an impedance of approximately 180 ohms, and capacitance of 34 pF (7.2 pF/ft.) Low capacitance cable characterized by a capacitance of 6.1 to 8.7 pF per foot is believed to provide the desired results. Such low capacitance cable is further characterized by signal conductors having a gauge in a range of about 32 to 40 AWG, center-to-center spacing in a range of about 0.036 to 0.070 inches.

Figure 12:
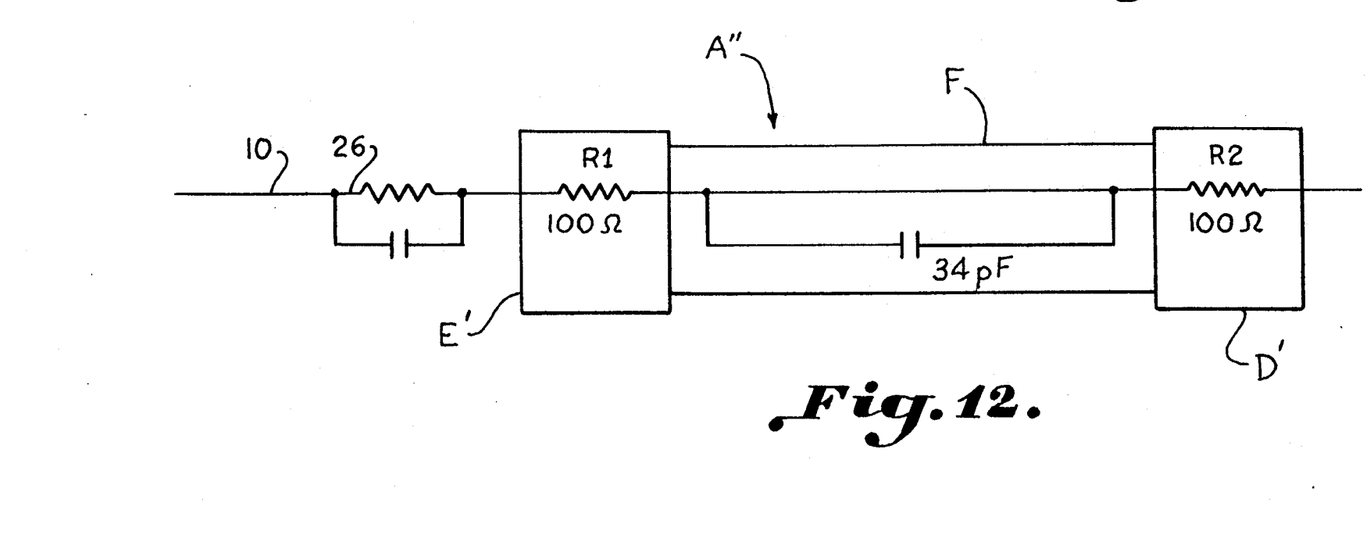
FIG. 12 is a schematic diagram of an electrical configuration of the embodiment of the invention shown in FIGS. 9 and 10.

Referring now to FIG. 12, an embodiment of a cable assembly A'' is illustrated which includes customized controlled impedance cable F is illustrated wherein cable F is woven with a specific controlled capacitance of, for example, 34 pF for a 56.75 inch cable. By providing the cable in a low capacitance configuration, capacitors C1 and C2 may be eliminated on the printed circuit boards of connectors 20 and 22 at the ends of the cable increasing reliability and performance. Resistors R1 and R2 are carried on PC boards 32 and 34, respectively, in resistor network means D' and E' to provide a reduction in reflections due to impedance mismatch and a sharp leading edge signal. The distributed capacitance of cable F reduces line to line cross talk and coupling over the length of the cable. More energy is available to transmit and provide a more accurate signal. The signal loading may be appreciably reduced by the distributed capacitance. While series resistors at opposite ends of the signal conductors 92 in cable F are believed to provide superior results, it is possible that a single series resistor may be satisfactory in some applications.

While matched resistors are shown in the resistor networks D' and E', it is also possible that unmatched resistors may be utilized. While basic cluster 98 is shown as including a single signal conductor 92 and adjacent ground conductors 94a, 94b, it is to be understood that additional ground conductors may be included in the cable between adjacent clusters.

The embodiment of FIG. 3 offers the potential for maximizing analyzer performance over narrow bandwidths of particular interest. All three embodiments provide a low capacitance at the probe tip to maximize use of the signal energy available and maximum signal accuracy. The controlled low capacitance filters out very high frequency noise components which are not of interest. Resistor-capacitor networks in conjunction with controlled impedance cable provides a means of providing a non loading cable assembly for test purposes which is unique and provides high fidelity test signals with minimum losses and cross coupling.

Thus, it can be seen that an advantageous construction can be had for a logic analyzer cable, or like equipment, to have a more effective bandwidth over a broader band. The logic signals have a sharpened leading edge over a broader bandwidth making it easier to do timing analysis. The cable probes have a high input resistance and a low input capacitance to minimize signal loading, and to maximize signal accuracy.

While a preferred embodiment of the invention has been described using specific terms, such description is for illustrative purposes only, and it is to be understood that changes and variations may be made without departing from the spirit or scope of the following claims.

What is claimed is:

1. A cable assembly for transmitting high frequency signals to electrical measuring instruments having a plurality of wire probe leads with probe tips connectable to a test circuit, a flat electrical cable having electrical characteristics matched with prescribed electrical input characteristics of said measuring instrument for accurately transmitting multiple signals from a test circuit over a wide frequency band to said measuring instrument, said electrical cable being terminated at a first end to a first connector connectable to an input of said measuring instrument having said prescribed electrical input characteristics and terminated at a second end to a second connector having pin sockets connectable to said probe leads, and an interface shroud carried by said second connector connecting said probe leads to said pin sockets of said second connector, said cable assembly comprising:

a first printed circuit board carried by said first connector;

a second printed circuit board carried by said second connector connected to said pin sockets;

a first resistor-capacitor network carried on said first printed circuit board and electrically connected between said electrical cable and said measuring instrument;

a second resistor-capacitor network carried on said second printed circuit board and electrically connected between said probe leads and said electrical cable;

said first and second resistor-capacitor networks having a prescribed ratio of capacitance values providing an increased effective bandwidth over which said cable assembly transmits said signals; and said first and second networks on said printed circuit boards having desired values and ratios so that the electrical characteristics of said cable assembly correspond to said input characteristics of said measuring instrument for accurately transmitting multiple signals from a test circuit over a wide frequency band to said measuring instrument.

2. The assembly of claim 1 wherein said capacitance of said first and second resistor-capacitor networks has a ratio in a range of about 1:1 to 3:1.

3. The assembly of claim 2 wherein said first resistor-capacitor network has a capacitance ratio of about 2:1 to said second resistor-capacitor network.

4. The assembly of claim 1 wherein said capacitance value of said first resistor-capacitor network is greater than the capacitance of said second resistor-capacitor network.

5. The assembly of claim 1 wherein said electrical cable is a flat woven electrical cable having a controlled impedance characteristic.

6. The assembly of claim 1 wherein said first and second PC boards are rotated 180 $^{degrees}$ for a one to one correspondence between contacts of said connectors.

7. The assembly of claim 1 wherein the capacitance of said cable is matched to the capacitance of said first and second networks.

8. The assembly of claim 1 wherein the capacitance of said cable is not matched to the capacitance of said first and second networks.

9. The assembly of claim 1 including locking means for locking terminals of said probe leads, said interface shroud, and said second connector together with terminals of said probe leads electrically connected with said electrical cable, said locking means including:

a plurality of exterior grooves extending longitudinally on an upper surface of said shroud, said exterior grooves being open-top for receiving said probe terminal carried by an end of said probe lead, and said probe terminal having a hinged locking arm in superposed relation to one said exterior groove with a depending locking element which locks in said exterior groove against longitudinal movements.

10. In combination with a measuring instrument, a cable assembly having a plurality of probe leads having probe tips connectable to a test circuit, wherein said cable assembly comprises:

an electrical cable having signal conductors and ground conductors extending longitudinally in said cable terminated at a first connector means connectable to said measuring instrument and terminated at a second end to a second connector means connectable to said probe leads;

a first resistor network means electrically connected between said signal conductors of said cable and said measuring instrument;

a second resistor network means electrically connected between said probe leads and said signal conductors of said cable;

said signal conductors and said ground conductors being spaced laterally in said cable to provide a low characteristic capacitance value for increasing the bandwidth for the transmission of accurate signals over a wide frequency range; and said cable has a capacitance in a range of about 6 to 8.5 pF per foot.

11. In combination with measuring instrument having an electrical input with prescribed electrical input characteristics, a cable assembly having electrical characteristics matched with said electrical input characteristics of said measuring instrument for accurately transmitting multiple signals from a test circuit over a wide frequency band to said measuring instrument, said cable assembly including a plurality of wire probe leads having probe tips connectable to a test circuit, wherein said cable assembly comprises:

a flat electrical cable having signal conductors and ground conductors extending longitudinally in said cable terminated at a first connector means connectable to said measuring instrument and terminated at a second end to a second having a plurality of pin sockets connector means connectable to said probe leads;

a first printed circuit board carried by said first connector means;

a second printed circuit board carried by said second connector means;

a first resistor network means carried on said first printed circuit board electrically connected between said signal conductors of said cable and said measuring instrument;

a second resistor network means carried on said second printed circuit board electrically connected between said pin sockets of said second connector and said signal conductors of said cable; and said signal conductors and said ground conductors being spaced laterally in said cable to provide a low characteristic capacitance value for increasing the bandwidth for the transmission of accurate signals over a wide frequency range; and said first and second networks on said printed circuit boards having desired values so that the electrical characteristics of said cable assembly have a desired correspondence to said input characteristics of said measuring instrument and multiple signals are transmitted by said cable assembly from said test circuit over a wide frequency band.

12. The assembly of claim 11 wherein first and second network means include respective first and second RC circuit means, and wherein said capacitance of said first and second resistor-capacitor means has a ratio in a range of about 1:1 to 3:1.

13. The assembly of claim 12 wherein said first resistor-capacitor means has a capacitance greater than the capacitance of said second resistor-capacitor means.

14. The assembly of claim 11 wherein said first resistor network means includes a collection of resistors connected between a first plurality of lands on said first printed circuit board to which said conductors are terminated, and a second plurality of lands electrically connected to connector contacts of said first connector means; and said second resistor network means includes a collection of resistors connected between a first plurality of lands on said second printed circuit board to which said conductors are terminated, and a second plurality of lands electrically connected to connector contacts of said second connector means.

15. The assembly of claim 11 wherein said first and second printed circuit boards are rotated 180 degrees for a one to one correspondence between contacts of said connectors.

16. A cable assembly for measuring instruments having a plurality of probe leads having probe tips connectable to a test circuit, an electrical cable terminated at a first connector connectable to said measuring instrument and terminated at a second end to a second connector connectable to said probe leads, said assembly comprising:

an interface shroud for interfacing said probe leads and said second connector, said interface shroud having a housing consisting of an upper wall, a lower wall spaced from and parallel to said upper wall, first and second spaced faces bridging said upper and lower walls, said first and second side walls integral with said upper and lower walls, and said first and second faces;

a connector opening for receiving said second connector formed within said first face of said shroud and a plurality of vertical slots for receiving individual probe terminals formed in said second face of said shroud;

a plurality of exterior grooves formed on said upper wall of said shroud corresponding to said vertical slots, said exterior grooves extending longitudinally along said upper wall from an open end to a detent below a surface level of said exterior grooves; and each said probe terminal including a terminal body and a superposed hinged locking arm having a locking element depending downwardly for engaging in said detent of one of said exterior locking grooves, and said locking element being received through said open end of said exterior groove.

17. The assembly of claim 16 wherein said locking elements of said probe terminals depend downwardly in a trigger ramp terminating in a locking cam which is received in said detent, and said trigger ramp is above said upper wall of said shroud when said locking cam is engaged in said detent to provide a trigger by means of which said locking arm may be positively disengaged from said exterior groove and said terminal removed from said shroud.

18. The assembly of claim 16 including a lateral ridge formed on said connector and a lateral detent formed within said connector opening of said shroud which interfit together to provide a lock between said connector and said shroud.

19. The assembly of claim 16 wherein each said exterior groove includes a runner floor which terminates in said detent, said locking element of said terminal body sliding along said runner floor as said terminal is inserted into said corresponding vertical slot of said interface shroud.

20. The assembly of claim 16 wherein each said vertical slot enters a correspondingly shaped shroud cavity, said terminal body of said probe terminal and said shroud cavity corresponding generally in cross-section so that there is a tight fit between said terminal body and said shroud cavity for a reliable electrical and mechanical connection.

* * * * *